(12) United States Patent
Nakata et al.

(10) Patent No.: US 8,120,019 B2
(45) Date of Patent: Feb. 21, 2012

(54) ORGANIC LIGHT-EMITTING ELEMENT HAVING TETRACYANO COMPOUND AND DISPLAY DEVICE

(75) Inventors: Koichi Nakata, Yokohama (JP); Kazunori Ueno, Glen Waverly (AU); Koichi Suzuki, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 330 days.

(21) Appl. No.: 12/335,290

(22) Filed: Dec. 15, 2008

(65) Prior Publication Data

US 2009/0166615 A1 Jul. 2, 2009

(30) Foreign Application Priority Data

Dec. 18, 2007 (JP) ................................. 2007-325914

(51) Int. Cl.
*H01L 51/54* (2006.01)
(52) U.S. Cl. ............ 257/40; 257/86; 257/642; 257/759; 257/E51.026; 257/E25.008; 257/E25.009; 257/E51.001
(58) Field of Classification Search ............... 257/40, 257/E51.026, 86, 642, E51.001, E51.052, 257/E25.008, E25.009, 759
See application file for complete search history.

(56) References Cited

U.S. PATENT DOCUMENTS

| | | | | |
|---|---|---|---|---|
| 2007/0108893 A1* | 5/2007 | Lee et al. | ....................... | 313/504 |
| 2008/0122346 A1* | 5/2008 | Lyu et al. | ..................... | 313/504 |
| 2008/0171228 A1* | 7/2008 | Chen et al. | ..................... | 428/691 |

OTHER PUBLICATIONS

Chetkina L,X-ray diffractoin analysys of 1,3-BIS (Dicyanomethylene) Inddane and its Triethylammonium salt,Journal of Structural chemistry, vol. 32, No. 3, 1991, pp. 49-54.*

* cited by examiner

*Primary Examiner* — Marc Armand
(74) *Attorney, Agent, or Firm* — Canon U.S.A., Inc., IP Division

(57) ABSTRACT

An organic light-emitting element has an anode, a cathode, and a layer including an organic compound between the anode and the cathode. The layer including the organic compound has at least one tetracyano compound represented by at least one of Formula (1) or (2) below.

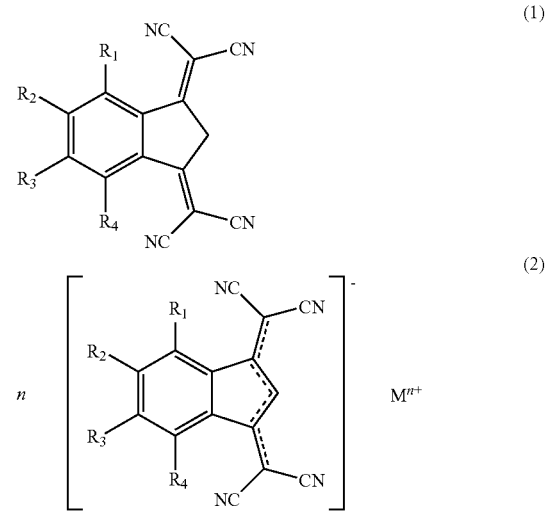

In Formula (1), $R_1$ to $R_4$ are each a hydrogen atom, a halogen atom, a substituted or unsubstituted alkyl group, a substituted or unsubstituted alkoxy group, a substituted or unsubstituted aralkyl group, a substituted or unsubstituted aromatic group, a nitro group, or a cyano group. In Formula (2), n represents an integer of 1 to 2, $M^{n+}$ is a metal ion or an onium cation, and $R_1$ to $R_4$ are as defined in formula (1).

7 Claims, 5 Drawing Sheets

ORGANIC LIGHT-EMITTING ELEMENT HAVING TETRACYANO COMPOUND AND DISPLAY DEVICE

BACKGROUND OF THE INVENTION

1. Field of the Invention

The present invention generally relates to an organic light-emitting element and a display device.

2. Description of the Related Art

Several developments have allowed for improvement in the performance of organic light-emitting elements, such as improvements in emission efficiency, color purity of the emitted light, and service life.

Furthermore, a number of acceptor compounds have heretofore been used as constituent materials of organic light-emitting elements, both as charge injection materials and charge transport materials.

The application to organic light-emitting elements of acceptor compounds such as tetracyanoquinodimethane, has been studied.

Tetrafluoro-tetracyanoquinodimethane compounds used as constituent materials of organic light-emitting elements have been reported in APPLIED PHYSICS LETTERS, 2001, Vol. 78, No. 4, January, and ADVANCED FUNCTIONAL MATERIALS, 2001, 11, No. 4, August.

However, when such acceptor compounds are used as constituent materials of organic light-emitting elements, the initial characteristics such as emission efficiency, and endurance characteristics such as luminance degradation caused by long-term emission, may not be sufficient.

Acceptor compounds having a tetracyano structure can form ammonium salts. Methods for manufacturing such acceptor compounds and ammonium salts thereof are described in J. Heterocyclic Chem., 43, 1037 (2006). However, examples of applying such compounds to organic light-emitting elements have not yet been reported.

SUMMARY OF THE INVENTION

In one embodiment, an organic light-emitting element in accordance with the present invention includes an anode, a cathode, and a layer having an organic compound between the anode and the cathode. The layer having the organic compound includes at least one tetracyano compound represented by at least one of Formula (1) or (2) below.

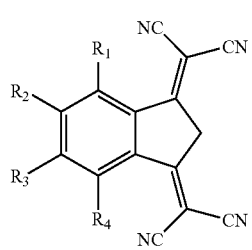

(1)

In Formula (1), $R_1$ to $R_4$ are each a hydrogen atom, a halogen atom, a substituted or unsubstituted alkyl group, a substituted or unsubstituted alkoxy group, a substituted or unsubstituted aralkyl group, a substituted or unsubstituted aromatic group, a nitro group, or a cyano group.

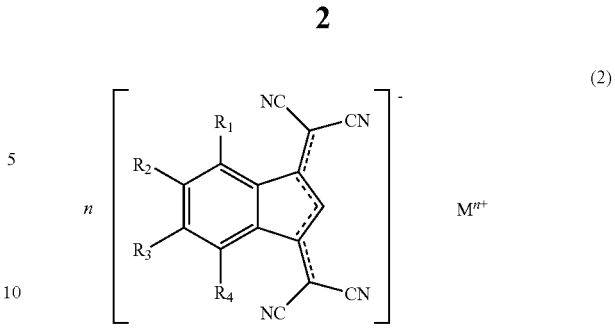

(2)

In Formula (2), n represents integer of 1 to 2, $M^{n+}$ is a metal ion or an onium cation, and $R_1$ to $R_4$ are as defined in Formula (1) above.

Further features of the present invention will become apparent from the following description of exemplary embodiments with reference to the attached drawings.

DESCRIPTION OF THE EMBODIMENTS

Figure 1:
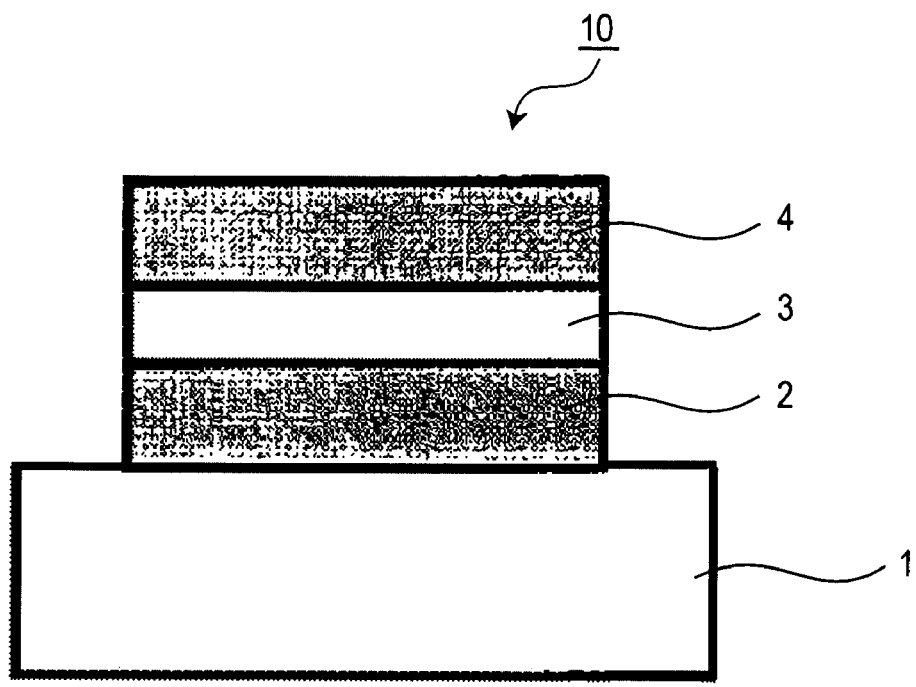
FIG. 1 is a cross-sectional view illustrating a first embodiment of the organic light-emitting element in accordance with the present invention.

The present invention will be described below in greater detail. In one embodiment, the organic light-emitting element in accordance with the present invention comprises an anode, a cathode, and a layer having an organic compound that is between the anode and the cathode.

Embodiments of the organic light-emitting element in accordance with the present invention will be described below with reference to the appended drawings. The following reference numerals are used in the figures: 1—a substrate, 2—an anode, 3—a light-emitting layer, 4—a cathode, 5—a hole transport layer, 6—an electron transport layer, 7—a hole injection layer, 8—an electron injection layer, 9—a hole/exciton blocking layer, and 10, 20, 30, 40, 50, 60, 70, 94—each an organic light-emitting element. 80, 100—each a display device, 81—a scan signal driver, 82—an information signal driver, 83—a current supply source, 84, 90—each a pixel circuit, 91—a first thin-film transistor (TFT 1), 92—a capacitor ($C_{add}$), 93—a second thin-film transistor (TFT 2), 101—a substrate, 102—a moisture-proofing layer, 103—a gate electrode, 104—a gate insulating film, 105—a semiconductor film, 106—a drain electrode, 107—a source electrode, 108—a TFT element, 109—an insulating film, 110—a contact hole (through hole), 111—an anode, 112—an organic layer, 113—a cathode, 114—a first protective layer, 115—a second protective layer.

FIG. 1 is a cross-sectional view illustrating a first embodiment of the organic light-emitting element in accordance with the present invention. In the organic light-emitting element 10 in FIG. 1, the anode 2, light-emitting layer 3, and cathode 4 are sequentially provided on the substrate 1. The organic light-emitting element 10 shown in FIG. 1 may be useful, for example, in a case in which the light-emitting layer 3 comprises an organic compound combining hole transport ability, electron transport ability, and light emission ability. Furthermore, the organic light-emitting element may also be useful, for example, when the light-emitting layer is obtained by mixing organic compounds, each having at least one characteristic selected from among the hole transport ability, electron transport ability, and light emission ability.

Figure 2:
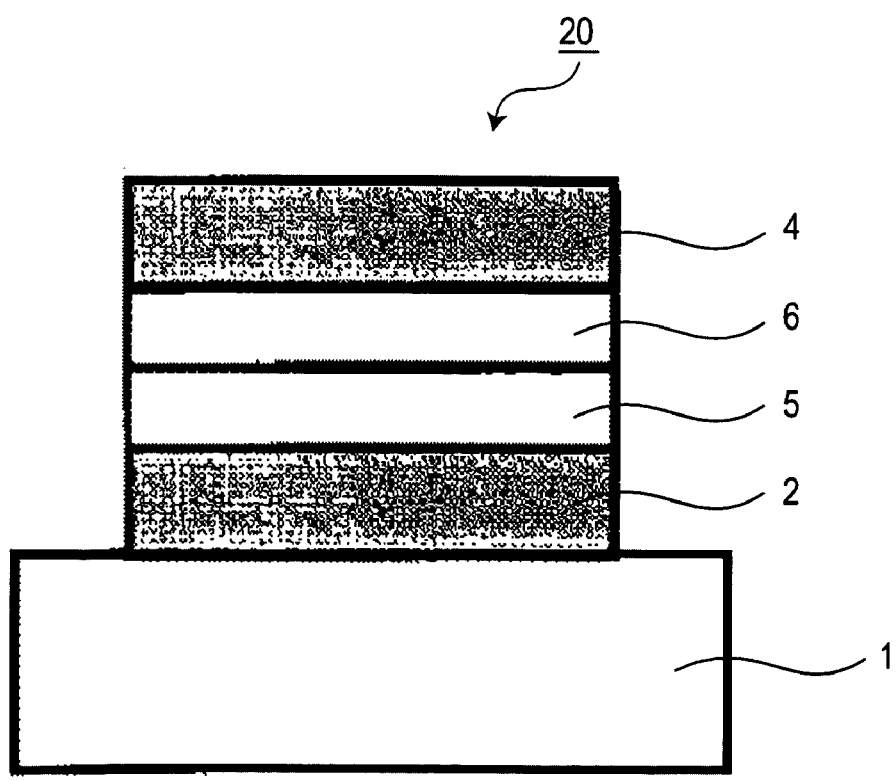
FIG. 2 is a cross-sectional view illustrating a second embodiment of the organic light-emitting element in accordance with the present invention.

FIG. 2 is a cross-sectional view illustrating a second embodiment of the organic light-emitting element in accordance with the present invention. In the organic light-emitting element 20 shown in FIG. 2, the anode 2, hole transport layer 5, electron transport layer 6, and cathode 4 are sequentially provided on the substrate 1. The organic light-emitting element 20 shown in FIG. 2 may be useful, for example, when a light-emitting organic compound having any of hole transport ability and electron transport ability is used in combination with an organic compound having only the electron transport ability or only the hole transport ability. Furthermore, in the organic light-emitting element 20 shown in FIG. 2, the hole transport layer 5 or electron transport layer 6 also serves as a light-emitting layer.

Figure 3:
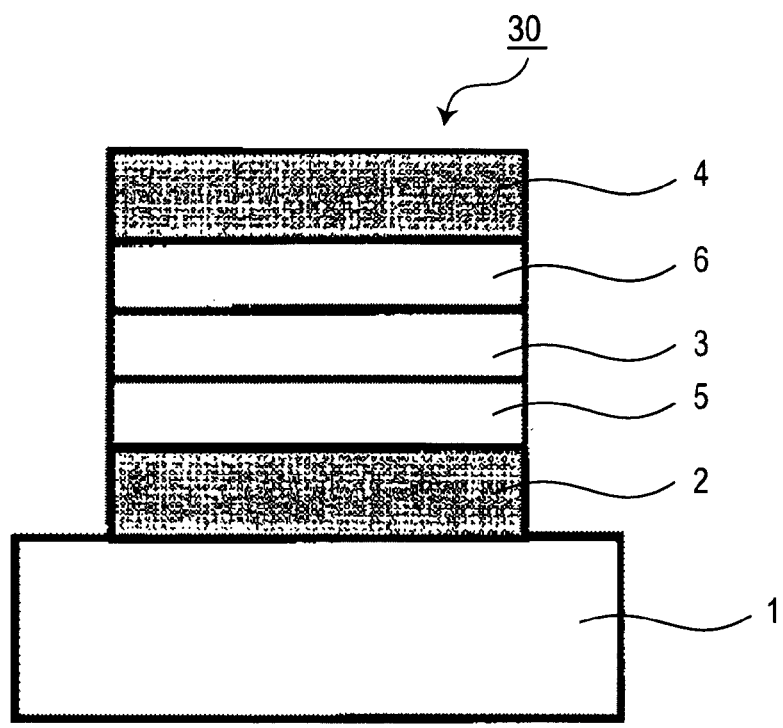
FIG. 3 is a cross-sectional view illustrating a third embodiment of the organic light-emitting element in accordance with the present invention.

FIG. 3 is a cross-sectional view illustrating a third embodiment of the organic light-emitting element in accordance with the present invention. The organic light-emitting element 30 shown in FIG. 3 has the configuration of the organic light-emitting element 20 as shown in FIG. 2, but is further modified in that a light-emitting layer 3 is provided between the hole transport layer 5 and the electron transport layer 6. In the organic light-emitting element 30 shown in FIG. 3, the carrier transport function and the light emission function are separated, and organic compounds having respective characteristics selected from among the hole transport ability, electron transport ability, and light emission ability, can be used in combination. As a result, the degree of freedom in selecting suitable materials may be increased, and various compounds with different emission wavelengths can be used. Therefore, the variety of emission hues may also be increased. Further, it may also be possible to effectively confine the carriers or excitons to the central light-emitting layer 3, thereby increasing the emission efficiency of the organic light-emitting element 30.

Figure 4:
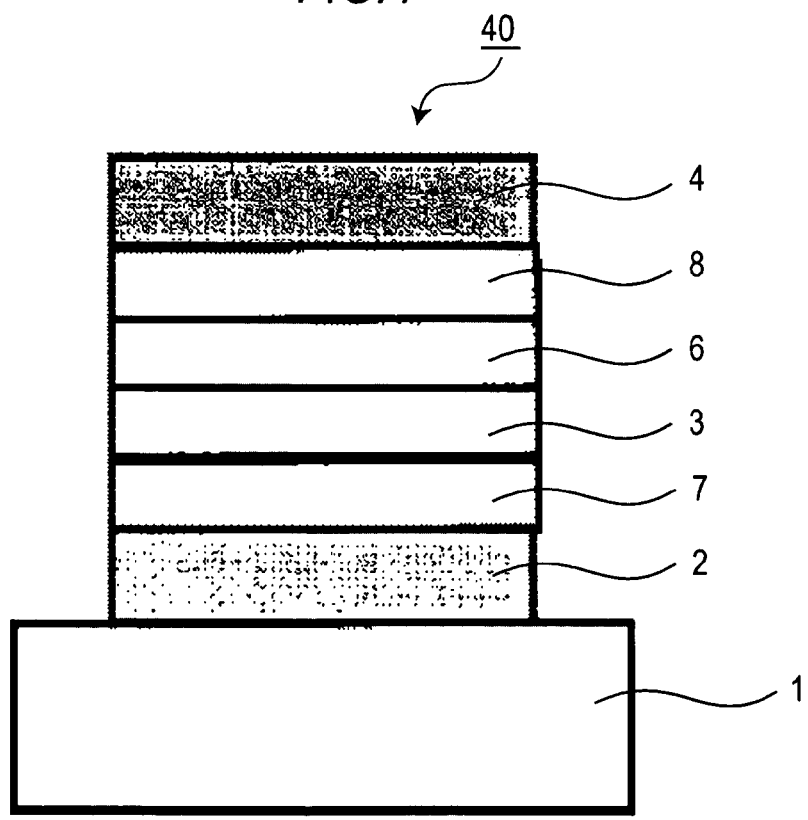
FIG. 4 is a cross-sectional view illustrating a fourth embodiment of the organic light-emitting element in accordance with the present invention.

FIG. 4 is a cross-sectional view illustrating a fourth embodiment of the organic light-emitting element in accordance with the present invention. The organic light-emitting element 40 shown in FIG. 4 has the configuration of the organic light-emitting element 30 as shown in FIG. 3, but is further modified in that the electron injection layer 8 is provided between the electron transport layer 6 and cathode 4. Because the electron injection layer 8 is provided in the organic light-emitting element 40 shown in FIG. 4, adhesion of the cathode 4 and electron transport layer 6 and the hole injection ability may be improved. Therefore, the voltage supplied may be effectively reduced. A hole injection layer 7 is further provided in the organic light-emitting element 40 shown in FIG. 4.

Figure 5:
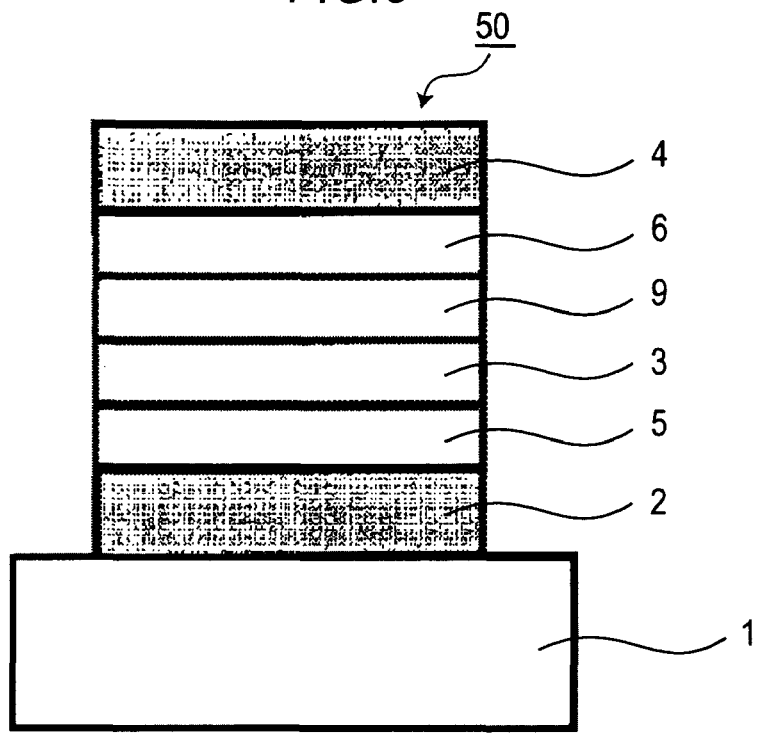
FIG. 5 is a cross-sectional view illustrating a fifth embodiment of the organic light-emitting element in accordance with the present invention.

FIG. 5 is a cross-sectional view illustrating a fifth embodiment of the organic light-emitting element in accordance with the present invention. The organic light-emitting element 50 shown in FIG. 5 has the configuration of the organic light-emitting element 30 as shown in FIG. 3, but is further modified in that the hole/exciton blocking layer 9 is provided between the light-emitting layer 3 and the electron transport layer 6. Because the hole/exciton blocking layer 9 is provided in the organic light-emitting element 50 shown in FIG. 5, the penetration of holes or excitons from the light-emitting layer to the cathode can be inhibited. Therefore, such a configuration may be effective in increasing the emission efficiency of the element.

Figure 6:
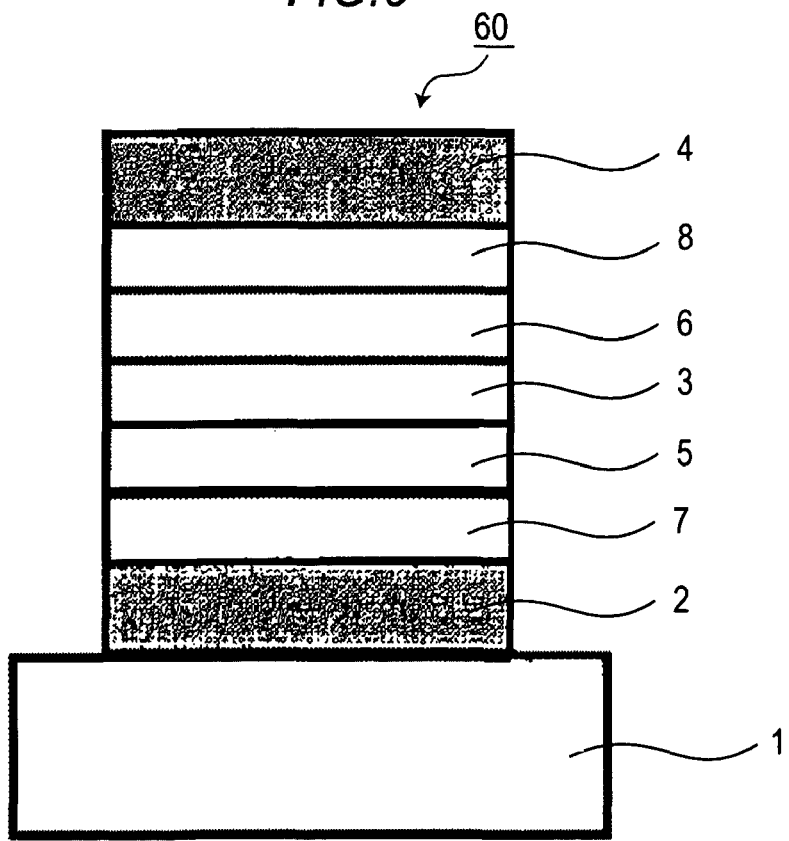
FIG. 6 is a cross-sectional view illustrating a sixth embodiment of the organic light-emitting element in accordance with the present invention.

FIG. 6 is a cross-sectional view illustrating a sixth embodiment of the organic light-emitting element in accordance with the present invention. The organic light-emitting element 60 shown in FIG. 6 has the configuration of the organic light-emitting element 40 as shown in FIG. 4, but is further modified in that the hole injection layer 7 is provided between the anode 2 and the hole transport layer 5. The effect produced by providing the hole injection layer 7 in the organic light-emitting element shown in FIG. 6 may be an additional decrease in voltage.

Figure 7:
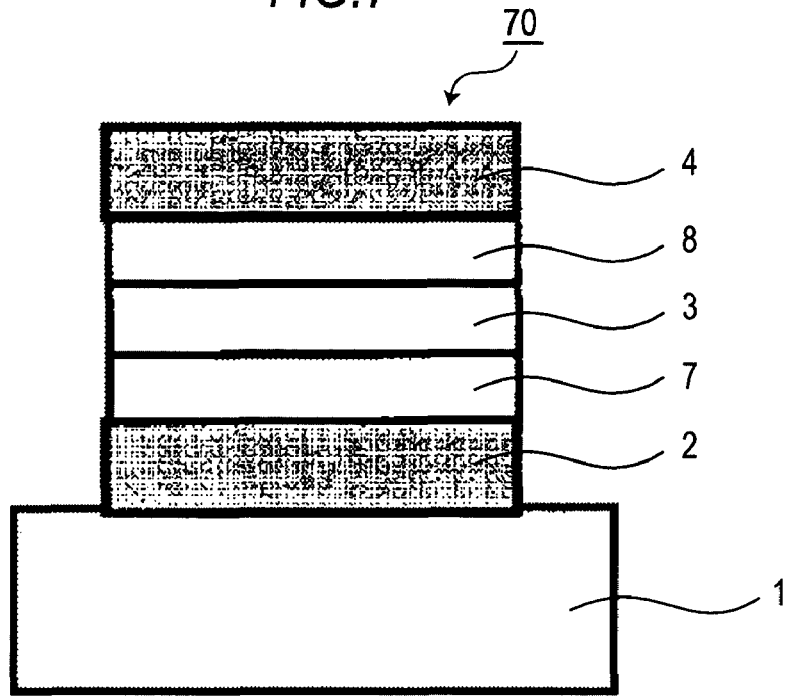
FIG. 7 is a cross-sectional view illustrating a seventh embodiment of the organic light-emitting element in accordance with the present invention.

FIG. 7 is a cross-sectional view illustrating a seventh embodiment of the organic light-emitting element in accordance with the present invention. In the organic light-emitting element 70 shown in FIG. 7, the anode 2, hole injection layer 7, light-emitting layer 3, electron injection layer 8, and cathode 4 are provided in the order of description on the substrate 1.

The element configurations shown in FIG. 1 to FIG. 7 are intended only as illustrations of basic element configurations, and the configuration of the organic light-emitting element in accordance with the present invention is not intended to be limited thereto. For example, a large variety of layered structures can be employed that have at least one of an insulating layer, an adhesive layer, and an interference layer on the interfaces of electrodes and organic layer, and/or in which at least one of a hole injection layer and hole transport layer comprises two layers with different ionization potentials.

In one embodiment of an organic light-emitting element in accordance with the present invention, at least one tetracyano compound represented by Formula (1) below is contained in the layer including an organic compound (i.e., an organic compound layer).

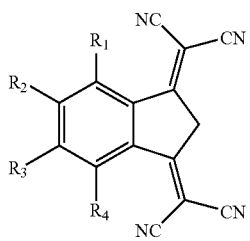

(1)

In Formula (1), $R_1$ to $R_4$ are each a hydrogen atom, a halogen atom, a substituted or unsubstituted alkyl group, a substituted or unsubstituted alkoxy group, a substituted or unsubstituted aralkyl group, a substituted or unsubstituted aromatic group, a nitro group, or a cyano group.

Examples of the halogen atom represented by $R_1$ to $R_4$ can include a fluorine atom, a chlorine atom, a bromine atom, and an iodine atom.

Examples of the alkyl group represented by $R_1$ to $R_4$ can include, but are not limited to, a methyl group, an ethyl group, an n-propyl group, an n-butyl group, a t-butyl group, a 3-methylbutyl group, a 2-ethylhexyl group, and an octyl group.

Examples of the alkoxy group represented by $R_1$ to $R_4$ can include, but are not limited to, a methoxy group, an ethoxy group, an n-propoxy group, an n-butoxy group, and a t-butoxy group.

Examples of the aralkyl group represented by $R_1$ to $R_4$ can include, but are not limited to, a benzyl group, a phenethyl group, and a naphthylmethyl group.

Examples of the aromatic group represented by $R_1$ to $R_4$ can include, but are not limited to, a phenyl group, a biphenyl group, an m-terphenyl group, a p-terphenyl group, a naphthyl group, and an anthryl group.

Examples of substituents that may be contained in the alkyl group, alkoxy group, aralkyl group, and aromatic group can include, for example, one or more of alkyl groups, such as at least one of a methyl group, an ethyl group, an n-propyl group, an n-butyl group, a t-butyl group, a 3-methylbutyl group, a 2-ethylhexyl group, and an octyl group; aralkyl groups, such as at least one of a benzyl group, a phenethyl group, and a naphthylmethyl group; aromatic groups, such as at least one of a phenyl group, a biphenyl group, an m-terphenyl group, and a p-terphenyl group; condensed polycyclic aromatic groups, such as at least one of a fluorenyl group, a naphthyl group, an anthranyl group, a phenanthryl group, a fluoranthenyl group, and a pyrenyl group; and halogen atoms, such as at least one of fluorine, chlorine, bromine, and iodine.

In another embodiment, the organic light-emitting element in accordance with the present invention may also include at least one tetracyano compound represented by Formula (2) below, for example instead of or in combination with the tetracyano compound represented by Formula (1).

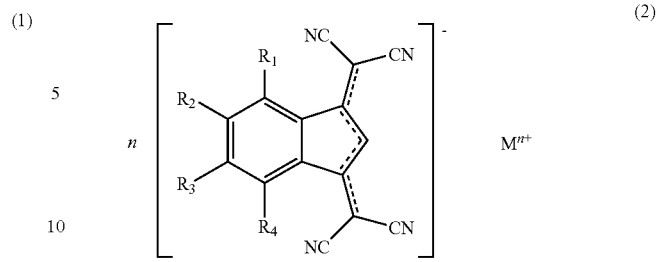

(2)

In Formula (2), $R_1$ to $R_4$ are each a hydrogen atom, a halogen atom, a substituted or unsubstituted alkyl group, a substituted or unsubstituted alkoxy group, a substituted or unsubstituted aralkyl group, a substituted or unsubstituted aromatic group, a nitro group, or a cyano group, as in Formula (1) above.

Specific examples the halogen atom, alkyl group, alkoxy group, aralkyl group, and aromatic group represented by $R_1$ to $R_4$, and substituents that may be contained in the alkyl group, alkoxy group, aralkyl group, and aromatic group are identical to the specific examples of $R_1$ to $R_4$ in Formula (1).

In Formula (2), n represents an integer of 1 to 2.

In Formula (2), $M^{n+}$ is a metal ion or an onium cation.

Examples of the metal ion represented by $M^{n+}$ can include, but are not limited to, alkali metal ions such as a lithium ion, a sodium ion, a potassium ion, a cesium ion, and alkaline earth metal ions such as a magnesium ion, a calcium ion, and a strontium ion.

Examples of the onium cation represented by $M^{n+}$ can include, but are not limited to, an ammonium ion, a sulfonium ion, a phosphonium ion, a fluoronium ion, a chloronium ion, a bromonium ion, an iodonium ion, an antimonium ion, a selenonium ion, and an oxonium ion.

When the metal ion or onium cation represented by $M^{n+}$ has a valence of two or more, a salt may be used in which one such metal ion or onium cation is combined with several tetracyano compound ions, with the number of the ions corresponding to the valence of the metal ion or onium cation.

In one version, from among the aforementioned metal ions and onium cations, an ammonium ion may be provided, such as an ammonium ion represented by Formula (3) below.

(3)

In Formula (3), $R_{11}$ to $R_{13}$ are each a substituted or unsubstituted alkyl group, a substituted or unsubstituted aralkyl group, or a substituted or unsubstituted aromatic group.

Examples of the alkyl group represented by $R_{11}$ to $R_{13}$ can include, but are not limited to, a methyl group, an ethyl group, an n-propyl group, an n-butyl group, a t-butyl group, a 3-methylbutyl group, a 2-ethylhexyl group, and an octyl group.

Examples of the aralkyl group represented by $R_{11}$ to $R_{13}$ can include, but are not limited to, a benzyl group, a phenethyl group, and a naphthylmethyl group.

Examples of the aromatic group represented by $R_{11}$ to $R_{13}$ can include, but are not limited to, a phenyl group, a biphenyl group, an m-terphenyl group, a p-terphenyl group, a naphthyl group, and an anthryl group.

Examples of substituents that may be contained in the alkyl group, alkoxy group, aralkyl group, and aromatic group can include, for example, one or more of alkyl groups, such as at least one of a methyl group, an ethyl group, an n-propyl group, an n-butyl group, a t-butyl group, a 3-methylbutyl group, a 2-ethylhexyl group, and an octyl group; aralkyl groups, such as at least one of a benzyl group, a phenethyl group, and a naphthylmethyl group; aromatic groups, such as at least one of a phenyl group, a biphenyl group, an m-terphenyl group, and a p-terphenyl group; condensed polycyclic aromatic groups, such as at least one of a fluorenyl group, a naphthyl group, an anthranyl group, a phenanthryl group, a fluoranthenyl group, and a pyrenyl group; and halogen atoms, such as at least one of fluorine, chlorine, bromine, and iodine.

The tetracyano compounds according to at least one of Formulas (1) and (2) can be synthesized by a method described in J. Heterocyclic Chem., 43, 1037 (2006).

More specifically, a reaction solution prepared by mixing indane-1,3-dione and malononitrile in a solvent is reacted for several hours under heating. A tetracyano compound according to Formula (1) may be obtained by conducting such a reaction.

In this case, a tetracyano compound according to Formula (2) can be obtained by additionally introducing into the reaction solvent a compound that generates an onium cation, such as an amine compound. For example, a tetracyano compound of Formula (2), in which an ammonium ion represented by Formula (3) serves as an onium cation (M) can be obtained by heating indane-1,3-dione and malononitrile for several hours in the presence of an amine compound represented by Formula (4) below.

$$R_{11}R_{12}R_{13}N \qquad (4)$$

Wherein, in Formula (4), $R_{11}$ to $R_{13}$ are identical to $R_{11}$ to $R_{13}$ of Formula (3).

The tetracyano compounds according to at least one of Formulas (1) and (2) can further be purified by, for example, sublimation purification or the like.

The tetracyano compound of Formula (1) has an active methylene group. As a result, salts can be formed with various cations, as in the case of the tetracyano compound of Formula (2). In particular, it may be possible to obtain an ammonium salt relatively easily when an amine is present during synthesis.

Representative examples of tetracyano compounds in accordance with the present invention are presented below. However, the present invention is not intended to be limited thereto.

EXAMPLE COMPOUND

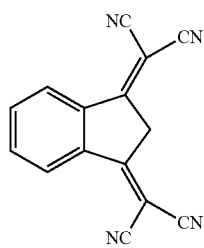

No. 1-1

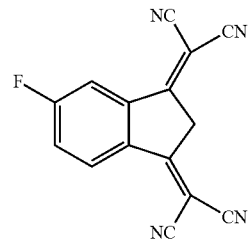

No. 1-2

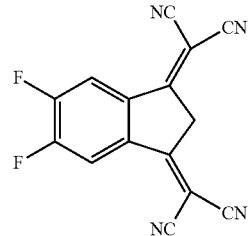

No. 1-3

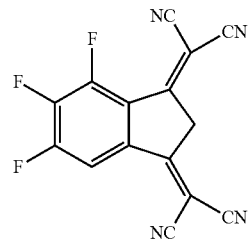

No. 1-4

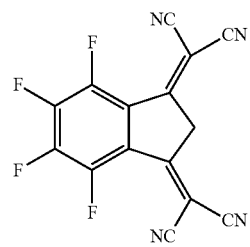

No. 1-5

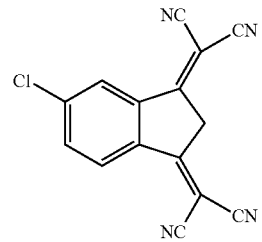

No. 1-6

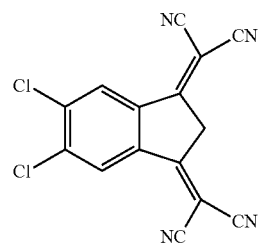

No. 1-7

-continued
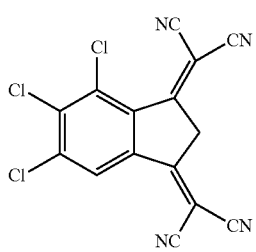
No. 1-8
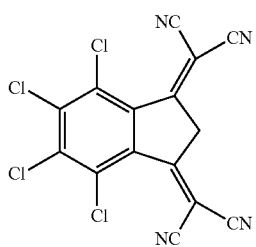
No. 1-9
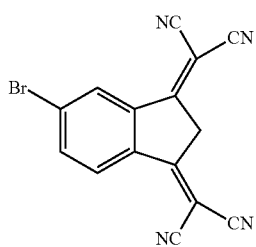
No. 1-10
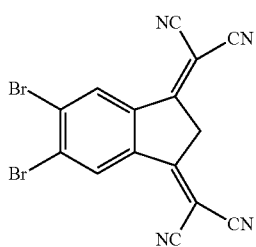
No. 1-11
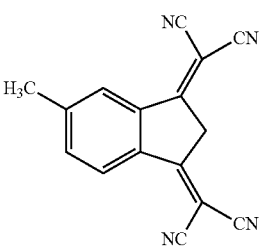
No. 1-12
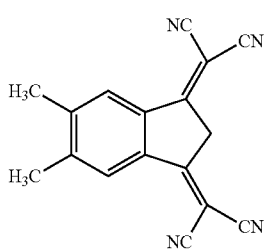
No. 1-13
-continued
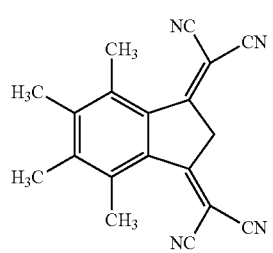
No. 1-14
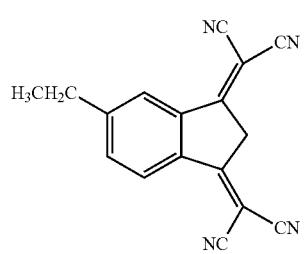
No. 1-15
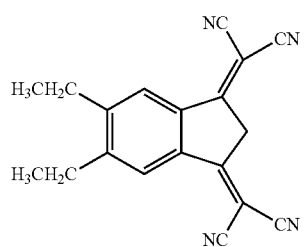
No. 1-16
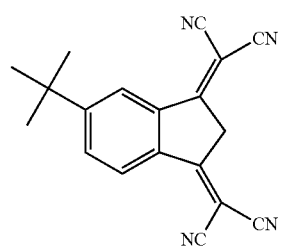
No. 1-17
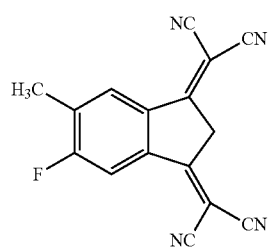
No. 1-18
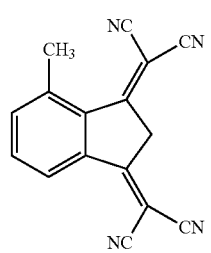
No. 1-19

No. 1-20 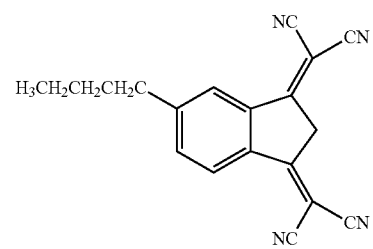
No. 1-21 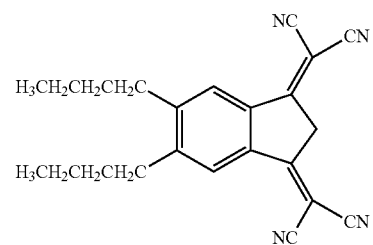
No. 1-22 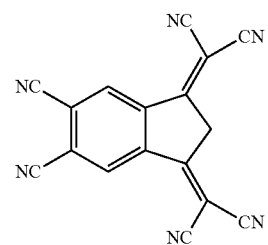
No. 1-23 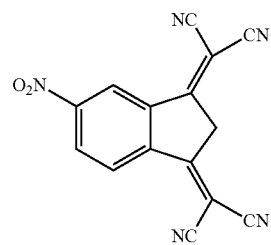
No. 1-24 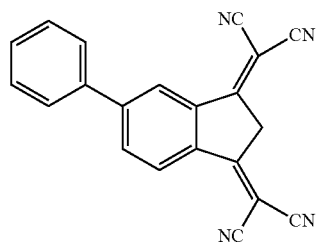
No. 1-25 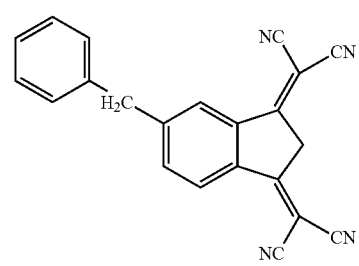
No. 2-1 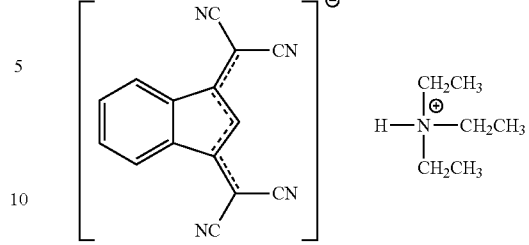
No. 2-2 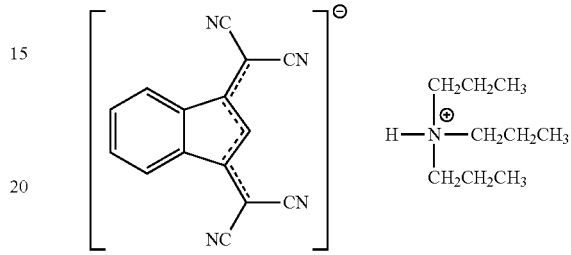
No. 2-3 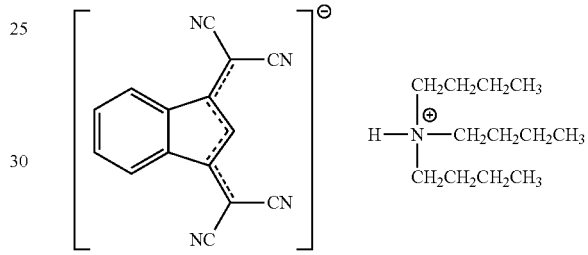
No. 2-4 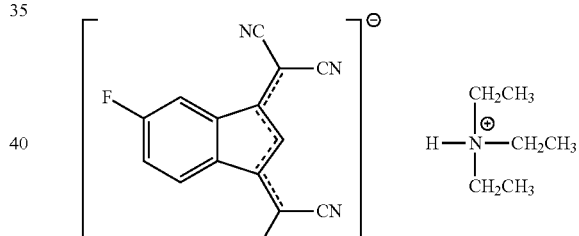
No. 2-5 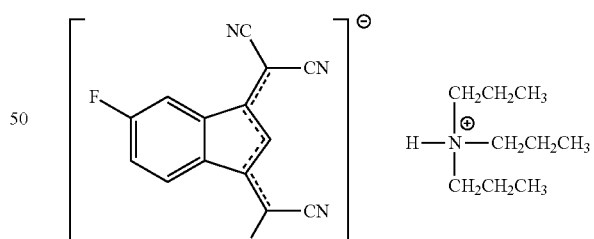
No. 2-6 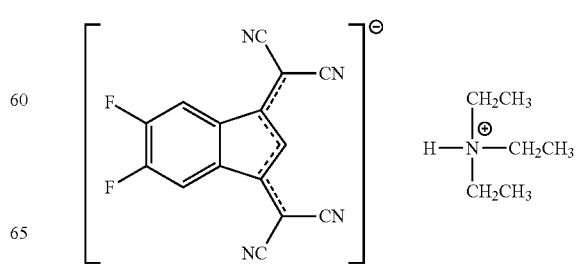

No. 2-7 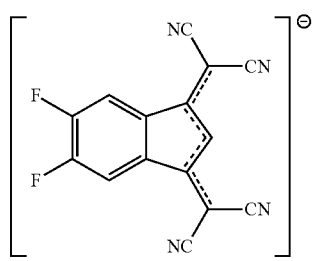 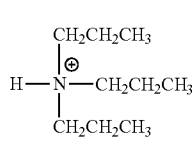
No. 2-8 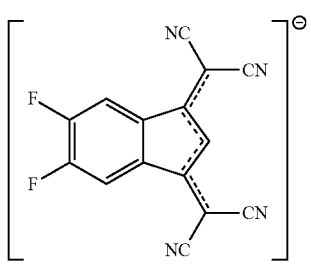 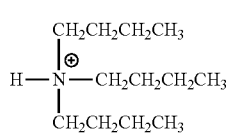
No. 2-9 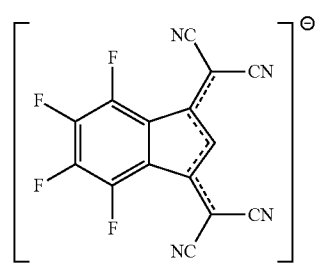 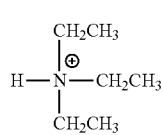
No. 2-10 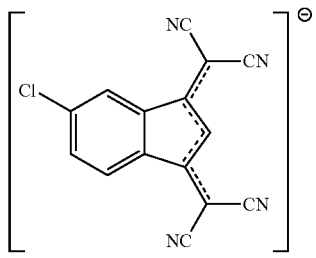 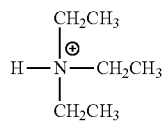
No. 2-11 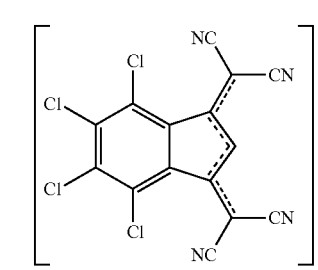 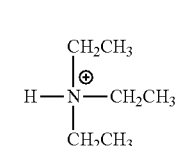
No. 2-12 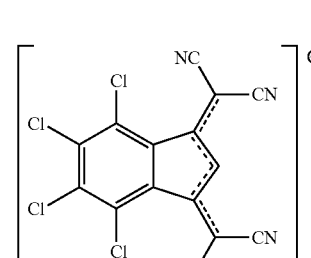 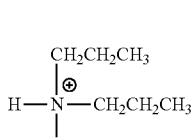
No. 2-13 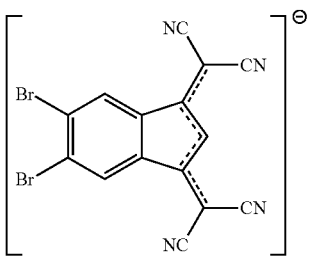 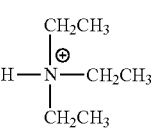
No. 2-14 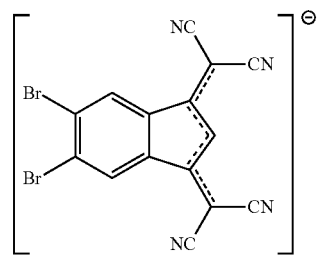 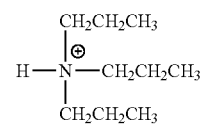
No. 2-15 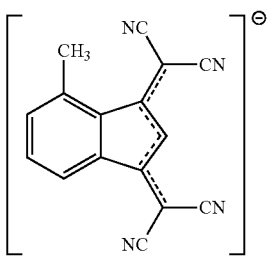 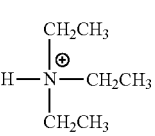
No. 2-16 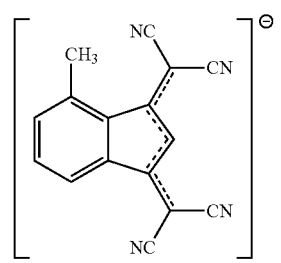 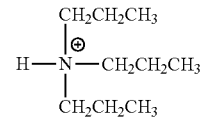
No. 2-17 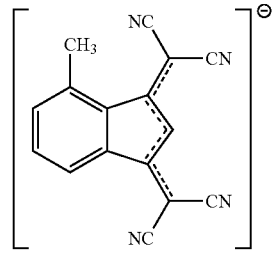 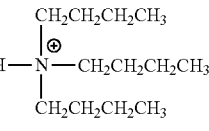
No. 2-18 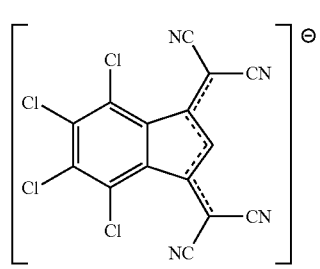

No. 2-19

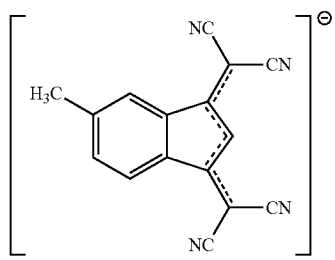
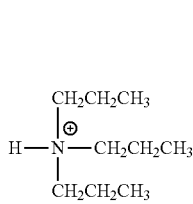

No. 2-20

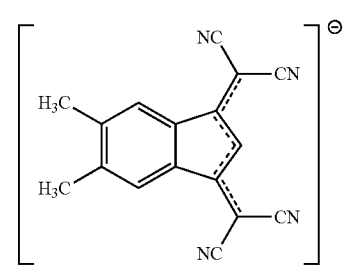
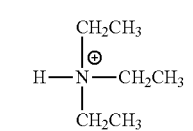

No. 2-21

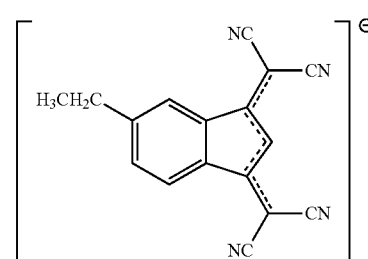
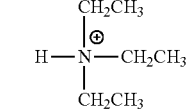

No. 2-22

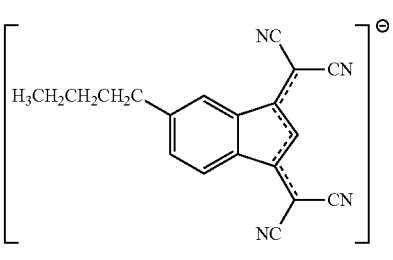
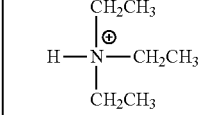

No. 2-23

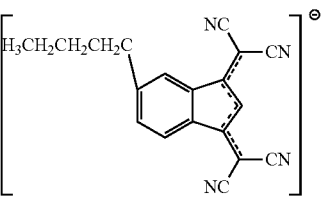
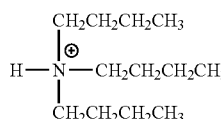

No. 2-24

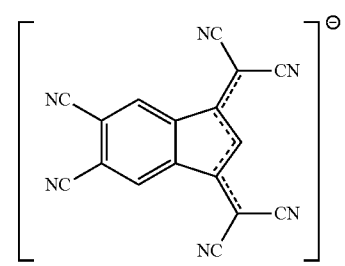
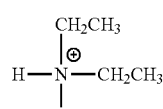

No. 2-25

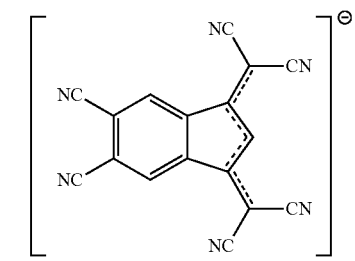
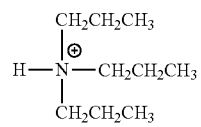

No. 2-26

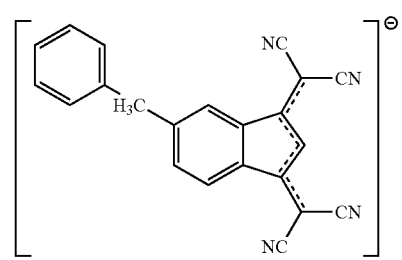
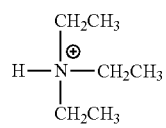

No. 2-27

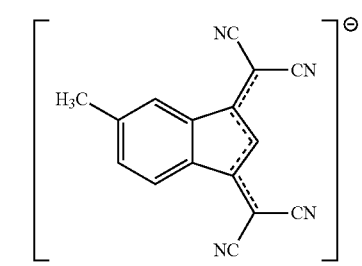
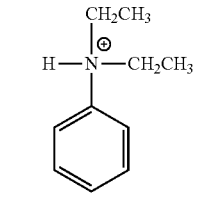

In one embodiment, one or more tetracyano compounds represented by at least one of Formulas (1) and (2) are contained in the organic compound layer. In this case, the tetracyano compound may be contained only in one layer, or may be contained in a plurality of layers.

In the organic light-emitting element in accordance with the present invention, the organic compound layer may comprise one or more of the light-emitting layer 3, hole transport layer 5, electron transport layer 6, hole injection layer 7, electron injection layer 8, and hole/exciton blocking layer 9, as shown for example in FIGS. 1 to 7. In one version, the tetracyano compound may be contained in at least one of the hole transport layer 5 and hole injection layer 7.

In one version, when a tetracyano compound according to at least one of Formulas (1) and (2) is provided in any one or more of the hole transport layer 5 and hole injection layer 7, the tetracyano compound may be used individually. However, in another version, the tetracyano compound may be also used in a mixture with a donor compound, such as for example at least one of an aromatic amine and an electrically conductive polymer.

When the tetracyano compound according to at least one of Formulas (1) and (2) is used in a mixture with a donor compound, such as an aromatic amine and an electrically conductive polymer, the content ratio of the tetracyano compound may be 0.1 wt. % or more and 50 wt. % or less, based on the entire weight of the materials constituting the layer. For example, the content ratio of 0.5 wt. % or more and 30 wt. % or less may be provided.

In one version, the tetracyano compound according to at least one of Formulas (1) and (2) may be contained in at least one of the electron transport layer 6 and electron injection layer 8 in the organic light-emitting element in accordance with the present invention.

In one version, when the tetracyano compound according to at least one of Formulas (1) and (2) is used as a constituent material of at least one of the electron transport layer 6 and electron injection layer 8 of the organic light-emitting element, the tetracyano compound may be used individually. In another version, when the compound is used in the form of a metal salt or onium salt, as in the tetracyano compound of Formula (2), it may be used in a mixture with at least one of an acceptor compound, a conductive polymer, a salt, and the like.

When the tetracyano compound of Formula (2) is used in a mixture with at least one of an acceptor compound, a conductive polymer, a salt, and the like, the content ratio of the tetracyano compound may be 0.1 wt. % or more and 50 wt. % or less, based on the total weight of the materials constituting the layer. For example, the content ratio of 0.5 wt. % or more and 30 wt. % or less may be provided.

In yet another version of the organic light-emitting element in accordance with the present invention, the tetracyano compound according to at least one of Formulas (1) and (2) may be contained in the light-emitting layer 3.

In one version, when the tetracyano compound according to at least one of Formulas (1) and (2) is used as a constituent material of the light-emitting layer 3, the light-emitting layer 3 may comprise only the tetracyano compound as the host and/or guest material, or the layer may comprise both a host and a guest material.

In one embodiment, when the tetracyano compound of at least one of Formulas (1) and (2) is used as a guest material of the light-emitting layer 3, one or more of a condensed polycyclic aromatic compound including a derivative such as at least one of a phenanthrene, pyrene, and fluorene, a distyryl benzidine derivative compound, and polyvinyl carbazole, can be employed as the corresponding host.

When the tetracyano compound of at least one of Formulas (1) and (2) is used as a guest of the light-emitting layer 3, the content ratio of the tetracyano compound may be 0.1 wt. % or more and 50 wt. % or less, based on the total weight of the materials constituting the layer. For example, the content ratio of 0.5 wt. % or more and 30 wt. % or less may be provided.

In another embodiment, when the tetracyano compound of at least one of Formulas (1) and (2) is used as a host of the light-emitting layer 3, at least one of an alumiquinolinol complex, an iridium complex, a condensed polycyclic aromatic compound, and the like, can be used as the corresponding guest.

When the tetracyano compound of at least one of Formulas (1) and (2) is used as a host of the light-emitting layer 3, the content ratio of the tetracyano compound may be 50 wt. % or more and 99.9 wt. % or less, based on the total weight of the materials constituting the layer. For example, a content ratio of 70 wt. % or more and 99.5 wt. % or less may be provided.

The organic light-emitting element in accordance with the present invention can also use one or more of a hole transport compound, light-emitting compound, or electron transport compound in combination with the tetracyano compound as constituent materials.

Examples of the hole transport compound can include, in addition to the tetracyano compound of at least one of Formulas (1) and (2), one or more of a triphenylamine compound, a benzidine compound, a phthalocyanine compound, and a polysilane compound.

Examples of the light-emitting compound can include, in addition to the tetracyano compound of at least one of Formulas (1) and (2), one or more of a fluorene compound, a pyrene compound, and a stilbene compound.

Examples of the electron transport compound can include, in addition to the tetracyano compound of at least one of Formulas (1) and (2), one or more of a phenanthroline compound, an oxadiazole compound, and an alumiquinolinol compound.

In one version, a material with a relatively large work function may be provided as the material constituting the anode 2. Examples of suitable materials can include, but are not limited to, individual metals such as gold, silver, platinum, nickel, palladium, cobalt, selenium, and vanadium, and alloys in which these individual metals are combined. Furthermore, conductive metal oxides such as tin oxide, zinc oxide, indium tin oxide (ITO), and indium zinc oxide can be also used. Conductive polymers such as polyaniline, polypyrrole, polythiophene, and polyphenylenesulfide can be also used. These electrode substances may be used individually or in combination of two or more thereof.

In another version, a material with a relatively small work function may be provided as the material constituting the cathode 4. Examples of such materials can include, but are not limited to, individual metals such as lithium, sodium, potassium, cesium, calcium, magnesium, aluminum, indium, silver, lead, tin, and chromium, alloys in which these metals are combined, and salts thereof. Metal oxides such as indium tin oxide (ITO) can be also used. The cathode may have a monolayer structure or a multilayer structure.

The substrate 1 used in the organic light-emitting element in accordance with the present invention is not particularly limited, and an opaque substrate such as for example at least one of a metallic substrate and a ceramic substrate, or a transparent substrate such as at least one of glass, quartz, and a plastic sheet can be used. Color light emission can be controlled by using at least one of a color filter film, a fluorescent color conversion filter film, a dielectric reflective film, and the like on the substrate.

In one version, the produced organic light-emitting element can be provided with a protective layer or a sealing layer, with the object of reducing and even preventing contact with oxygen or moisture. Examples of suitable protective layers can include, but are not limited to, inorganic material films such as a diamond film and films from metal oxides and metal nitrides and polymer films or photocurable resin films such as films from fluororesin, polyparaxylene, polyethylene resins, silicone resins, polystyrene resins, polyester resins, polyamide resins, and polyimide resins. Furthermore, in one version, the element can be covered with at least one of glass, a gas-impermeable film, and a metal, or the element itself can be packaged by using a sealing resin.

In one embodiment, the organic light-emitting element in accordance with the present invention can be finally covered with a protective layer. Materials having a function of inhibiting the penetration of substances that accelerate the element deterioration, such as moisture and oxygen, may be used for the protective layer. Specific examples of such materials may include, but are not limited to, metals such as In, Sn, Pb, Au, Cu, Ag, Al, Ti, and Ni, metal oxides such as MgO, SiO, $SiO_2$, $Al_2O_3$, GeO, NiO, CaO, BaO, $Fe_2O_3$, $Y_2O_3$, and $TiO_2$, metal fluorides such as $MgF_2$, LiF, $AlF_3$, and $CaF_2$, nitrides such as $SiN_x$ and $SiO_xN_x$, polyethylene, polypropylene, polymethyl methacrylate, polyimide, polyurea, polytetrafluoroethylene, polychlorotrifluoroethylene, polydichlorodifluoroethylene, chlorotrifluoroethylene-dichlorodifluoroethylene copolymer, copolymers obtained by copolymerizing a monomer mixture including tetrafluoroethylene and a comonomer of at least one kind, fluorine-containing copolymers having a ring structure in the main chain of the copolymer, water-absorbing substances with a water absorption ratio of 1% or higher, and a moisture-proofing substances with a water-absorption ratio of 0.1% or lower.

A version of a method for manufacturing the organic light-emitting element in accordance with an embodiment of the present invention will be explained below. In this version, a layer including at least one tetracyano compound according to one or more of Formulas (1) and (2), and other organic compound layers, may be formed by a vacuum deposition method or a coating method.

When a coating method is used, a coating composition may be prepared by dissolving the film-forming material in an appropriate solvent, and then forming a thin film by coating the prepared coating material on a target area. Examples of coating methods include one or more of a spin coating method, a slit coater method, a printing method, an inkjet method, a dispersing method, and a spraying method. In one version, when a film is formed by a coating method, the film can be formed in combination with an appropriate bonding resin.

The bonding resin can be selected from a wide range of resins with adhesive properties. Examples of such resins may include, but are not limited to, polyvinyl carbazole resins, polycarbonate resins, polyester resins, polyallylate resins, polystyrene resins, acrylic resins, methacrylic resins, butyral resins, polyvinyl acetal resins, diallylphthalate resins, phenolic resins, epoxy resins, silicone resins, polysulfone resins, urea resins. However, this list is not intended to be limiting. These resins may also be used individually or in mixtures of two or more thereof in the form of individual resins or copolymers.

When a protective layer is formed, a method for forming the protective layer is not particularly limited. Examples of suitable methods may include, but are not limited to, at least one of a vacuum vapor deposition method, a sputtering method, a reactive sputtering method, an MBE (molecular bean epitaxy) method, a cluster ion beam method, an ion plating method, a plasma polymerization method (high-frequency excited ion plating method), a plasma CVD method, a laser CVD method, a thermal CVD method, a gas-source CVD method, a coating method, a printing method, and a transfer method.

In the organic light-emitting element in accordance with the present invention, the thickness of the layer including the tetracyano compound according to at least one of Formulas (1) and (2) may be less than 10 µm, such as equal to or less than 0.5 µm, and even equal to or more than 5 nm and equal to or less than 500 nm.

On the other hand, the thickness of other organic compound layers that do not contain the tetracyano compound according to at least one of Formulas (1) and (2) may be less than 5 µm, such as equal to or less than 1 µm, and even equal to or more than 0.5 nm and equal to or less than 500 nm.

A coating composition including the tetracyano compound according to at least one of Formulas (1) and (2) will be described below.

The coating composition comprises at least one of the tetracyano compounds according to one or more of Formulas (1) and (2), and a solvent. Optionally, the above-described conventional hole transport compounds, light-emitting compounds, and electron transport compounds may also be added.

In one version, when the coating composition is used, the organic compound layers constituting the organic light-emitting element, in particular a charge injection layer or a charge transport layer, can be formed by a coating method, and an organic light-emitting element of a large surface area can be fabricated relatively easily and at a comparatively low cost.

Examples of solvents that can be used in the coating composition may include at least one of aliphatic hydrocarbon solvents such as n-pentene, n-hexene, n-heptane, and cyclohexane; aromatic hydrocarbon solvents such as toluene, xylene, methylene, tetraline, n-dodecyl benzene, and methyl naphthalene; ether solvents such as tetrahydrofuran, dioxane, and diglyme; ester solvents such as ethyl acetate, n-butyl acetate, and ethyl propionate; ketone solvents such as acetone, methyl ethyl ketone, and methyl isobutyl ketone; and halogen solvents such as dichloromethane, chloroform, dichloroethanes, monochlorobenzene, and 1,2-dichlorobenzene.

The content ratio of the tetracyano compound of at least one of Formulas (1) and (2) in the coating composition may be equal to or higher than 0.05 wt. % and equal to or lower than 20 wt. %, such as equal to or higher than 0.1 wt. % and equal to or higher than 5 wt. %, based on the entire coating composition.

The light emission efficiency or color purity of the organic light-emitting element in accordance with the present invention can be increased by various means. For example, the light emission efficiency can be increased and the sterna quantum efficiency can be raised by processing the substrate surface shape (for example, forming a fine peak-valley pattern), controlling the refractive index of the substrate, ITO layer, and organic layer, and controlling the thickness of the substrate, ITO layer, and organic layer.

Furthermore, in one version the so-called top emission system may be used, in which light emission proceeds from the anode side with the object of increasing the aperture ratio, or a cavity structure may optionally be used in which color purity is adjusted by light buffering.

The organic light-emitting element in accordance with the present invention can be applied to products to provide relatively low energy consumption and increased luminance. Examples of applications may include, but are not limited to, image display devices, light sources for printers, illumination devices, and backlights of liquid crystal display devices.

Examples of image display devices can include lightweight flat panel displays that have relatively low energy consumption and fairly high visibility.

As for light sources for printers, in one version the organic light-emitting element in accordance with the present invention can be used to replace a laser light source unit of laser beam printers. For example, a method of disposing of organic light-emitting elements that can be individually addressed on an array can be used as the replacement method. Even when the laser light source unit is replaced with the organic light-emitting element in accordance with the present invention, an image can be formed in by subjecting a photosensitive drum to an exposure. In one version, using the organic light-emitting element in accordance with the present invention may make it possible to significantly reduce the device volume.

In one version, using the organic light-emitting element in accordance with the present invention as an illumination device or backlight may provide a reduction in energy consumption.

An embodiment of a display device using the organic light-emitting element in accordance with the present invention is described below. The display device in accordance with the embodiment of the present invention is explained below in greater detail by considering an active matrix system by way of an example, with reference to the appended drawings.

Figure 8:
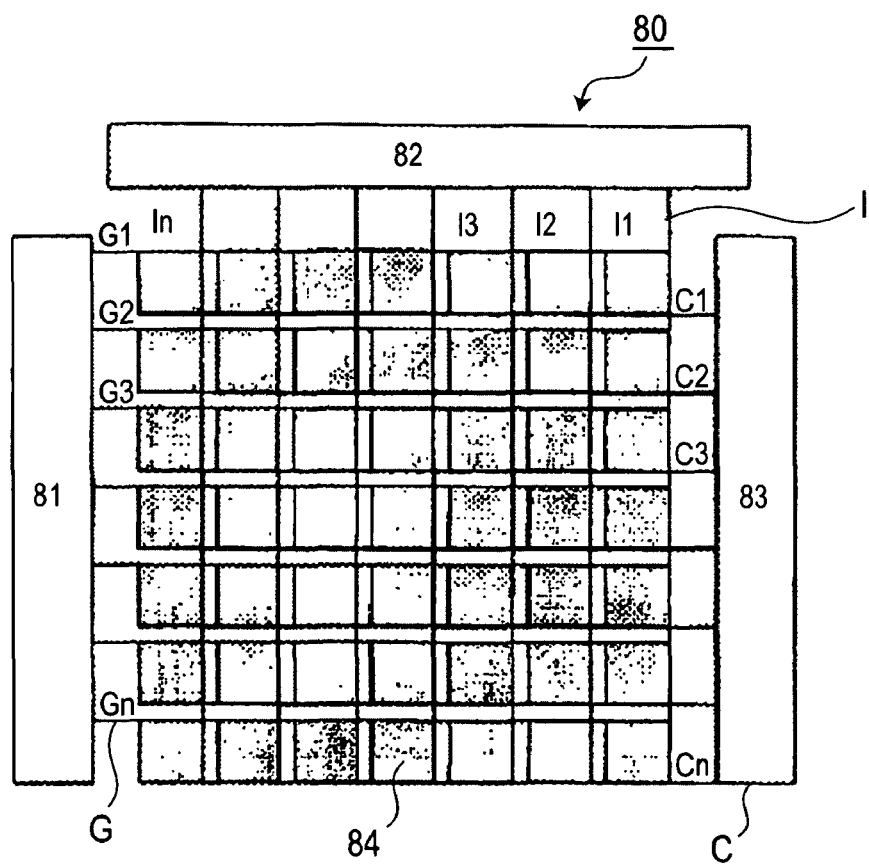
FIG. 8 illustrates schematically an embodiment of a configuration example of a display device including the organic light-emitting element in accordance with the present invention and a drive unit, this display device being an embodiment of the invention.

FIG. 8 illustrates schematically a configuration example of a display device including the organic light-emitting element in accordance with an embodiment of the present invention, and a drive means, this display device being an embodiment of the invention. The display device 80 shown in FIG. 8 includes a scan signal driver 81, an information signal driver 82, and a current supply source 83, which are connected to a gate selection line G, an information signal line I, and a current supply line C, respectively. A pixel circuit 84 is disposed in the intersection point of the gate selection line G and information signal line I. The scan signal driver 81 successively selects the gate selection lines G1, G2, G3, . . . Gn, and image signals are applied synchronously with this selection to the pixel circuits 84 via any one of the information signal lines I1, I2, I3, . . . In.

Figure 9:
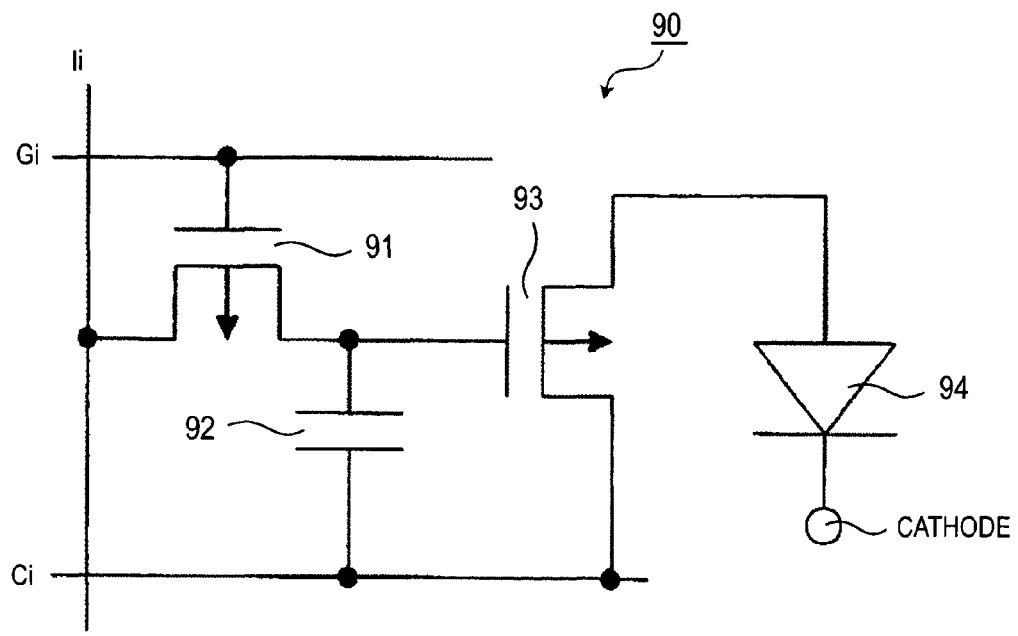
FIG. 9 is an embodiment of a circuit diagram illustrating a circuit constituting one pixel disposed in the display device shown in FIG. 8.

An embodiment of the operation of a pixel will be explained below. FIG. 9 is a circuit diagram illustrating a version of a circuit constituting one pixel disposed in the display device shown in FIG. 8. In the pixel circuit 90 shown in FIG. 9, where a selection signal is applied to the gate selection line G1, the first thin-film transistor (TFT 1) 91 is switched ON, an image signal Ii is supplied to the capacitor ($C_{add}$) 92, and the gate voltage of the second thin-film transistor (TFT 2) 93 is determined. An electric current is supplied to the organic light-emitting element 94 from the current supply line Ci in response to the gate voltage of the second thin-film transistor (TFT 2) 93. Here, the gate potential of the second thin-film transistor (TFT 2) 93 is held in the capacitor ($C_{add}$) 92 till the first thin-film transistor (TFT 1) 91 performs next scan selection. Therefore, the electric current continues to flow in the light-emitting element 94 till the next scan is performed. As a result, the light-emitting element 94 can be caused to emit light at a constant level within one frame period.

Figure 10:
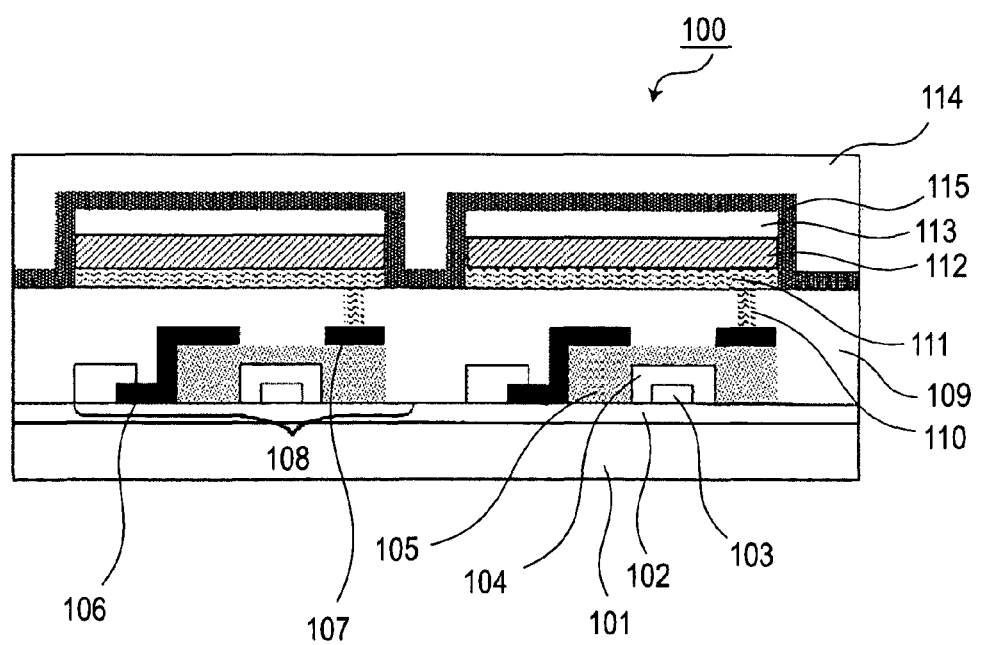
FIG. 10 is a schematic diagram illustrating an example of a cross-sectional structure of a TFT substrate used in the display device shown in FIG. 8.

FIG. 10 is a schematic diagram illustrating an example of a cross-sectional structure of a TFT substrate for use in the display device shown in FIG. 8. The structure will be explained below in greater detail with reference to an example of a process for manufacturing the TFT substrate. When the display device 100 shown in FIG. 10 is manufactured, in one embodiment the moisture-proofing layer 102 is first coated on a substrate 101 such as glass to protect the components (TFT or organic compound layer) located thereon. Examples of materials constituting the moisture-proofing layer 102 may include silicon oxide, and a composite of silicon oxide and silicon nitride. Then, a metal (e.g., Cr) film is produced by sputtering, thereby patterning a predetermined circuit shape and forming the gate electrode 103. Then, a film of silicon oxide or the like is produced by, for example, a plasma CVD method or a catalytic chemical vapor deposition method (cat-CVD method), and the film is patterned to form the gate insulating film 104. Then, a silicon film is produced by plasma CVD or the like (annealing may optionally be performed at a temperature equal to or higher than 290° C.), patterning is conducted according to the circuit shape, and the semiconductor layer 105 is formed.

The TFT element 108 is then fabricated by providing the drain electrode 106 and source electrode 107 on the semiconductor film 105, and a circuit such as shown in FIG. 9 is formed. The insulating film 109 is then formed on top of the TFT element 108. The contact hole (through hole) 110 is then formed so as to connect the metallic anode 111 and the source electrode 107 for an organic light-emitting element.

The display device 100 can be obtained by successively laminating the multilayer or monolayer organic layer 112 and the cathode 113 on the anode 111. In this case, one or more of a first protective layer 114 and second protective layer 115 may be provided to inhibit and even prevent the organic light-emitting element from deteriorating. By driving the display device using the organic light-emitting element in accordance with embodiments of the present invention, it may be possible to obtain a relatively stable display with good image quality even in long-term display.

The above-described display device is not intended to be limited to a switching element, and can also be applied to, for example, a single-crystal silicon substrate, a MIM element, and an a-Si type element.

EXAMPLES

The present invention will be described below with reference to the Examples, but the present invention is not intended to be limited to thereto.

Synthesis Example 1

Synthesis of Example Compound No. 2-1

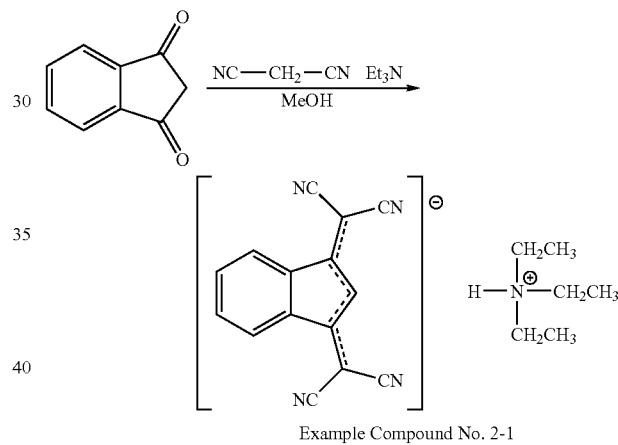

Example Compound No. 2-1

The following reagents and solvent were charged into a reaction vessel.

Triethylamine: 2 ml (14.3 mmol).

Indane-1,3-dione: 0.73 g (5 mmol).

Malononitrile: 0.66 g (10 mmol)

Methanol: 15 ml.

The reaction solution was stirred for 4 h, while being refluxed. Upon completion of the reaction, the reaction solution was cooled to room temperature and concentrated under reduce pressure to reduce the amount of the reaction liquid by half. The concentrated reaction solution was cooled in a refrigerator and allowed to stay. The produced crystals of deep blue color were filtered and washed with methanol on the filter. Crude crystals were then obtained by vacuum drying. A total of 310 mg (yield 18.2%) of Example Compound No. 2-1 was then obtained by sublimation purification of the obtained crude crystals at a temperature of 150° C. to 160° C. under a pressure of $1.8 \times 10^{-2}$ mbar.

The compounds (Example Compounds No. 1-1, 1-9, 2-11) used in the below-described examples can also be synthesized by the same or similar methods as described above.

Example 1

An organic light-emitting element having a structure (not shown) was produced.

The anode 2 was formed by forming a film of indium tin oxide (ITO) by sputtering on a glass substrate (substrate 1). The thickness of the anode 2 in this case was 120 nm. The substrate with the ITO patterned thereon was successively ultrasonically washed in acetone and isopropyl alcohol (IPA) and then washed in boiling IPA and dried. Then, UV/ozone washing was implemented for 40 min with a low-pressure mercury lamp. The substrate treated in the above-described manner was used as a transparent conductive support substrate.

A coating composition was then produced by mixing the following reagents and solvent in order to form the hole transport layer 5 by a coating method.

An aromatic diamine compound (A) represented by Formula (I) below: 99 parts by weight.

Aromatic diamine compound (A)

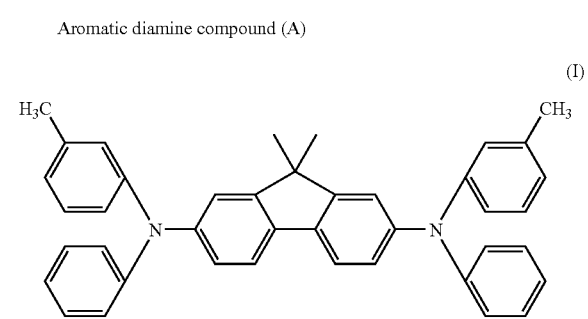

(I)

Example Compound No. 1-1: 1 part by weight.

Chloroform: 49900 parts by weight.

The coating composition was dropped on the anode 2 and a thin film was formed by spin coating. The thin film thickness in this case was 25 nm. The thin film was then heated and dried for 10 min at 80° C. to remove the solvent contained therein and form the hole transport layer 5.

A film of a light-emitting compound represented by Formula (II) below was then formed on the hole transport layer 5 by a vacuum vapor deposition method and the light-emitting layer 3 was formed. The thickness of the light-emitting layer 3 in this case was 30 nm.

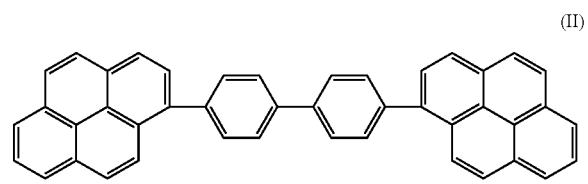

(II)

A film of bathophenathroline represented by Formula (III) below was then formed on the light-emitting layer 3 by a vacuum vapor deposition method to form the electron transport layer 6. The thickness of the electron transport layer 6 in this case was 25 nm.

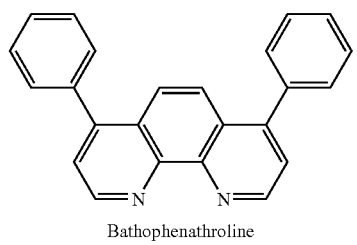

(III)

Bathophenathroline

A film of lithium fluoride was then formed on the electron transport layer 6 by a vacuum vapor deposition method to form the electron injection layer 8. The thickness of the electron injection layer 8 in this case was 0.5 nm. The vapor deposition was performed at a degree of vacuum of $1.0 \times 10^{-4}$ Pa and a deposition rate of 0.1 nm/sec.

An aluminum film was then formed on the electron injection layer 8 by a vacuum vapor deposition method to form the cathode 4. The thickness of the cathode 4 in this case was 120 nm. The vapor deposition was performed at a degree of vacuum of $1.0 \times 10^{-4}$ Pa and a deposition rate of 1.0 nm/sec to 1.2 nm/sec.

The structure obtained was then covered with a protective glass plate in a nitrogen atmosphere and sealed with an acrylic resin adhesive. An organic light-emitting element was thus obtained.

When a DC voltage of 6 V was applied to the element obtained by using the ITO electrode (anode 2) as a positive electrode and the Al electrode (cathode 4) as a negative electrode, an electric current passed through the element. The current density of the electric current flowing in the element in this case was 30 mA/cm$^2$, and blue light emission with a luminance of 1240 cd/m$^2$ was observed. The color coordinates of the element were NTSC (X, Y)=(0.15, 0.17).

When the application of the voltage was continued, while maintaining the current density at 20 mA/cm$^2$, the luminance after 50 h was 720 cd/m$^2$ with respect to the initial luminance of 860 cd/m$^2$. Therefore, the degradation of luminance was relatively small.

Example 2

An organic light-emitting element was produced by the same method as in Example 1, except that the coating composition in the process of Example 1 contained the following components.

Aromatic diamine compound (A) represented by Formula (1): 96 parts by weight.
Example Compound No. 1-1: 4 parts by weight.
Chloroform: 49900 parts by weight.

The element obtained was evaluated in the same manner as in Example 1. The results are shown in Table 1.

Example 3

An organic light-emitting element was produced by the same method as in Example 1, except that Example Compound No. 1-9 was used instead of Example Compound No. 1-1 when the coating composition was prepared in the same manner as in Example 1. The element obtained was evaluated in the same manner as in Example 1. The results are shown in Table 1.

Example 4

An organic light-emitting element was produced by the same method as in Example 2, except that Example Compound No. 1-9 was used instead of Example Compound No. 1-1 when the coating composition was prepared in the same manner as in Example 2. The element obtained was evaluated in the same manner as in Example 1. The results are shown in Table 1.

Example 5

An organic light-emitting element was produced by the same method as in Example 1, except that Example Compound No. 2-1 was used instead of Example Compound No. 1-1 when the coating composition was prepared in the same manner as in Example 1. The element obtained was evaluated in the same manner as in Example 1. The results are shown in Table 1.

Example 6

An organic light-emitting element was produced by the same method as in Example 2, except that Example Compound No. 2-1 was used instead of Example Compound No. 1-1 when the coating composition was prepared in the same manner as in Example 2. The element obtained was evaluated in the same manner as in Example 1. The results are shown in Table 1.

Example 7

An organic light-emitting element was produced by the same method as in Example 1, except that Example Compound No. 2-11 was used instead of Example Compound No. 1-1 when the coating composition was prepared in the same manner as in Example 1. The element obtained was evaluated in the same manner as in Example 1. The results are shown in Table 1.

Example 8

An organic light-emitting element was produced by the same method as in Example 2, except that Example Compound No. 2-11 was used instead of Example Compound No. 1-1 when the coating composition was prepared in the same manner as in Example 2. The element obtained was evaluated in the same manner as in Example 1. The results are shown in Table 1.

Comparative Example 1

An organic light-emitting element was produced by the same method as in Example 1, except that the coating composition in the process of Example 1 contained the following components.
Aromatic diamine compound (A) represented by Formula (1): 100 parts by weight.
Chloroform: 49900 parts by weight.
The element obtained was evaluated in the same manner as in Example 1. The results are shown in Table 1.

Comparative Example 2

An organic light-emitting element was produced by the same method as in Example 2, except that a benzoquinone derivative represented by Formula (IV) below was used instead of Example Compound No. 1-1 when the coating composition was prepared in the same manner as in Example 2. The element obtained was evaluated in the same manner as in Example 1. The results are shown in Table 1.

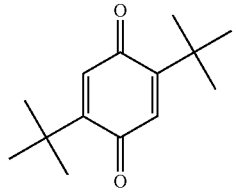

(IV)

TABLE 1

Benzoquinone derivative

| No. | Compound No. | Mixing ratio (%) | Initial characteristic, luminance at applied voltage 6 (V) (cd/m$^2$) | Endurance characteristic, initial luminance (cd/m$^2$) | Luminance after 50 h at current density 20 (mA/cm$^2$) |
| --- | --- | --- | --- | --- | --- |
| Example 1 | No. 1-1 | 1 | 1240 | 860 | 720 |
| Example 2 | No. 1-1 | 4 | 1190 | 830 | 690 |
| Example 3 | No. 1-9 | 1 | 1230 | 850 | 740 |
| Example 4 | No. 1-9 | 4 | 1190 | 820 | 710 |
| Example 5 | No. 2-1 | 1 | 1260 | 880 | 720 |
| Example 6 | No. 2-1 | 4 | 1200 | 820 | 670 |
| Example 7 | No. 2-11 | 1 | 1200 | 830 | 720 |
| Example 8 | No. 2-11 | 4 | 1170 | 790 | 700 |
| Comparative Example 1 | — | 0 | 1130 | 760 | 490 |
| Comparative Example 2 | Structural Formula (IV) | 4 | 570 | 310 | 110 |

Example 9

An organic light-emitting element having a structure shown in FIG. 6 was produced.

The anode 2 was formed by forming a film of indium tin oxide (ITO) by sputtering on a glass substrate (substrate 1). The thickness of the anode 2 in this case was 120 nm. The substrate with the ITO patterned thereon was successively ultrasonically washed in acetone and isopropyl alcohol (IPA) and then washed in boiling IPA and dried. Then, UV/ozone washing was implemented for 40 min with a low-pressure mercury lamp. The substrate treated in the above-described manner was used as a transparent conductive support substrate.

A film of the aromatic diamine compound (B) represented by Formula (V) was then formed on the hole injection layer 7 by a vacuum vapor deposition method and the hole transport layer 5 was formed. The thickness of the hole injection layer 7 in this case was 20 nm. The vapor deposition was performed at a degree of vacuum of $1.0 \times 10^{-4}$ Pa and a deposition rate of 0.2 nm/sec to 0.3 nm/sec.

A carbazole compound represented by Formula (VI) below and a fluorene compound represented by Formula (VII) below were co-deposited on the hole transport layer 5 by a vacuum vapor deposition method at a mass ratio of 90:10 to form the light-emitting layer 3. The thickness of the light-emitting layer 3 in this case was 24 nm. The vapor deposition was performed at a degree of vacuum of $1.0 \times 10^{-4}$ Pa and a deposition rate of 0.2 nm/sec to 0.3 nm/sec.

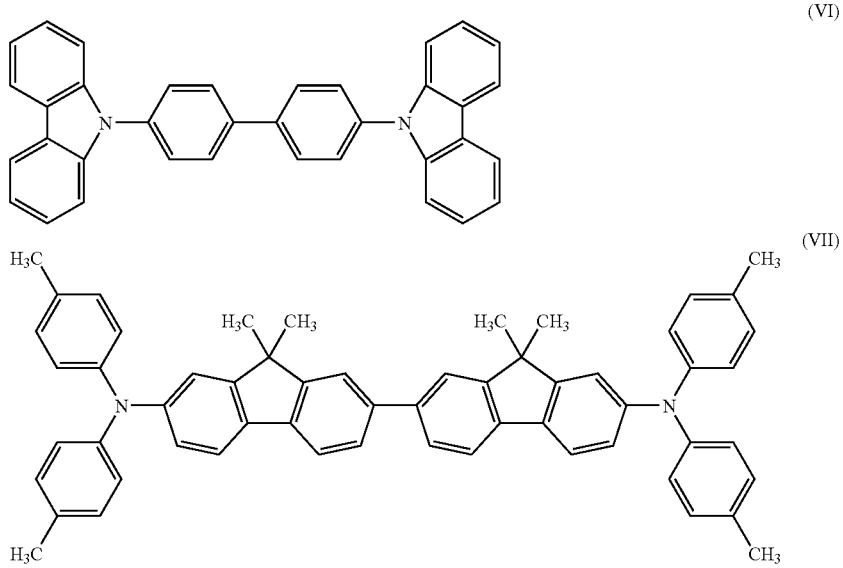

A coating composition was then produced by mixing the following reagents and solvent in order to form the hole injection layer 7 by a coating method.

An aromatic diamine compound (B) represented by Formula (V) below: 99 parts by weight.

Aromatic diamine compound (B)

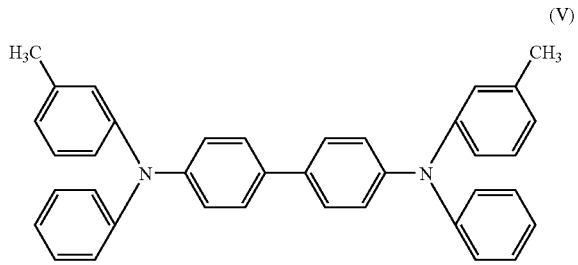

(V)

Example Compound No. 1-1: 1 part by weight.
Chloroform: 99900 parts by weight.

The coating composition was dropped on the anode 2 and a thin film was formed by spin coating. The thin film thickness in this case was 10 nm. The thin film was then heated and dried for 10 min at 80° C. to remove the solvent contained therein and form the hole injection layer 7.

A film of bathophenathroline represented by Formula (III) was then formed on the light-emitting layer 3 by a vacuum vapor deposition method to form the electron transport layer 6. The thickness of the electron transport layer 6 in this case was 40 nm. The vapor deposition was performed at a degree of vacuum of $1.0 \times 10^{-4}$ Pa and a deposition rate of 0.2 nm/sec to 0.3 nm/sec.

A film of lithium fluoride was then formed on the electron transport layer 6 by a vacuum vapor deposition method to form the electron injection layer 8. The thickness of the electron injection layer 7 in this case was 0.5 nm. The vapor deposition was performed at a degree of vacuum of $1.0 \times 10^{-4}$ Pa and a deposition rate of 0.1 nm/sec.

An aluminum film was then formed on the electron injection layer 8 by a vacuum vapor deposition method to form the cathode 4. The thickness of the cathode 4 in this case was 120 nm. The vapor deposition was performed at a degree of vacuum of $1.0 \times 10^{-4}$ Pa and a deposition rate of 1.0 nm/sec to 1.2 nm/sec.

The structure obtained was then covered with a protective glass plate in a nitrogen atmosphere and sealed with an acrylic resin adhesive. An organic light-emitting element was thus obtained.

When a DC voltage of 7 V was applied to the element obtained by using the ITO electrode (anode 2) as a positive electrode and the Al electrode (cathode 4) as a negative electrode, an electric current passed through the element. The current density of the electric current flowing in the element in this case was 60 mA/cm$^2$, and blue light emission with a luminance of 1850 cd/m$^2$ was observed. The color coordinates of the element were NTSC (X, Y)=(0.15, 0.12).

When the application of the voltage was continued, while maintaining the current density at 30 mA/cm$^2$, the luminance after 100 h was 760 cd/m$^2$ with respect to the initial luminance of 1010 cd/m$^2$. Therefore, the degradation of luminance was relatively small.

Example 10

An organic light-emitting element was produced by the same method as in Example 9, except that the coating composition in the process of Example 9 contained the following components.
Aromatic diamine compound (B) represented by Formula (V): 96 parts by weight.
Example Compound No. 1-1: 4 parts by weight.
Chloroform: 99900 parts by weight.
The element obtained was evaluated in the same manner as in Example 9. The results are shown in Table 2.

Example 11

An organic light-emitting element was produced by the same method as in Example 9, except that Example Compound No. 1-9 was used instead of Example Compound No. 1-1 when the coating composition was prepared in the same manner as in Example 9. The element obtained was evaluated in the same manner as in Example 9. The results are shown in Table 2.

Example 12

An organic light-emitting element was produced by the same method as in Example 10, except that Example Compound No. 1-9 was used instead of Example Compound No. 1-1 when the coating composition was prepared in the same manner as in Example 10. The element obtained was evaluated in the same manner as in Example 9. The results are shown in Table 2.

Example 13

An organic light-emitting element was produced by the same method as in Example 9, except that Example Compound No. 2-1 was used instead of Example Compound No. 1-1 when the coating composition was prepared in the same manner as in Example 9. The element obtained was evaluated in the same manner as in Example 9. The results are shown in Table 2.

Example 14

An organic light-emitting element was produced by the same method as in Example 10, except that Example Compound No. 2-1 was used instead of Example Compound No. 1-1 when the coating composition was prepared in the same manner as in Example 10. The element obtained was evaluated in the same manner as in Example 9. The results are shown in Table 2.

Example 15

An organic light-emitting element was produced by the same method as in Example 9, except that Example Compound No. 2-11 was used instead of Example Compound No. 1-1 when the coating composition was prepared in the same manner as in Example 9. The element obtained was evaluated in the same manner as in Example 9. The results are shown in Table 2.

Example 16

An organic light-emitting element was produced by the same method as in Example 10, except that Example Compound No. 2-11 was used instead of Example Compound No. 1-1 when the coating composition was prepared in the same manner as in Example 10. The element obtained was evaluated in the same manner as in Example 9. The results are shown in Table 2.

Comparative Example 3

An organic light-emitting element was produced by the same method as in Example 9, except that the coating composition in the process of Example 9 contained the following components.
Aromatic diamine compound (B) represented by Formula (V): 100 parts by weight.
Chloroform: 99900 parts by weight.
The element obtained was evaluated in the same manner as in Example 9. The results are shown in Table 2.

Comparative Example 4

An organic light-emitting element was produced by the same method as in Example 10, except that a benzoquinone derivative represented by Formula (IV) below was used instead of Example Compound No. 1-1 when the coating composition was prepared in the same manner as in Example 10. The element obtained was evaluated in the same manner as in Example 10. The results are shown in Table 2.

TABLE 2

| No. | Compound No. | Mixing ratio (%) | Initial characteristic, luminance at applied voltage 7 (V) (cd/m$^2$) | Endurance characteristic, initial luminance (cd/m$^2$) | Luminance after 100 h at current density 30 (mA/cm$^2$) |
| --- | --- | --- | --- | --- | --- |
| Example 9  | No. 1-1  | 1 | 1850 | 1010 | 760 |
| Example 10 | No. 1-1  | 4 | 1970 | 1100 | 850 |
| Example 11 | No. 1-9  | 1 | 1880 | 1020 | 800 |
| Example 12 | No. 1-9  | 4 | 2000 | 1130 | 870 |
| Example 13 | No. 2-1  | 1 | 1820 | 940  | 740 |
| Example 14 | No. 2-1  | 4 | 1840 | 990  | 750 |
| Example 15 | No. 2-11 | 1 | 1850 | 1010 | 750 |
| Example 16 | No. 2-11 | 4 | 1880 | 1030 | 760 |

TABLE 2-continued

| No. | Compound No. | Mixing ratio (%) | Initial characteristic, luminance at applied voltage 7 (V) (cd/m$^2$) | Endurance characteristic, initial luminance (cd/m$^2$) | Luminance after 100 h at current density 30 (mA/cm$^2$) |
|---|---|---|---|---|---|
| Comparative Example 3 | — | 0 | 1510 | 770 | 480 |
| Comparative Example 4 | Structural Formula (IV) | 4 | 890 | 410 | 220 |

The organic light-emitting element in accordance with the present invention can be used as a structural device of, for example, a display panel, a display device, and the like.

Organic light-emitting elements produced in accordance with the above-described examples may have good emission efficiency and relatively high endurance.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2007-325914, filed Dec. 18, 2007, which is hereby incorporated by reference herein in its entirety.

What is claimed is:

1. An organic light-emitting element comprising:
   an anode and a cathode and
   a layer comprising an organic compound between the anode and the cathode, wherein
   the layer comprising the organic compound includes at least one tetracyano compound represented by

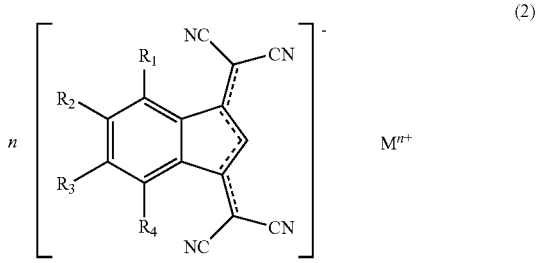

(2)

wherein in Formula (2), $R_1$ to $R_4$ are each selected from a hydrogen atom, a halogen atom, a substituted or unsubstituted alkyl group, a substituted or unsubstituted alkoxy group, a substituted or unsubstituted aralkyl group, a substituted or unsubstituted aromatic group, a nitro group, or a cyano group, n represents an integer of 1 to 2, and $M^{n+}$ is a metal ion or an onium cation.

2. The organic light-emitting element according to claim 1, wherein the onium cation is an ammonium ion represented by Formula (3) below

(3)

wherein in Formula (3), $R_{11}$ to $R_{13}$ are each a substituted or unsubstituted alkyl group, a substituted or unsubstituted aralkyl group, or a substituted or unsubstituted aromatic group.

3. The organic light-emitting element according to claim 1, wherein the layer comprising the organic compound includes at least one of a hole injection layer and a hole transport layer having the tetracyano compound contained therein.

4. The organic light-emitting element according to claim 1, wherein the layer comprising the organic compound includes at least one of an electron injection layer and an electron transport layer having the tetracyano compound contained therein.

5. The organic light-emitting element according to claim 1, wherein the layer comprising the organic compound includes a light-emitting layer having the tetracyano compound contained therein.

6. The organic light-emitting element according to claim 1, wherein the layer comprising the organic compound includes a hole/exciton blocking layer having the tetracyano compound contained therein.

7. A display device comprising the organic light-emitting element according to claim 1.

* * * * *